US012538595B2

(12) United States Patent
Nakata et al.

(10) Patent No.: US 12,538,595 B2
(45) Date of Patent: Jan. 27, 2026

(54) PHOTOELECTRIC CONVERSION APPARATUS HAVING DIVERGENCE OPTICAL CIRCUIT, PHOTOELECTRIC CONVERSION SYSTEM, AND MOVING BODY

(71) Applicant: CANON KABUSHIKI KAISHA, Tokyo (JP)

(72) Inventors: Yasushi Nakata, Kanagawa (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 649 days.

(21) Appl. No.: 17/832,455

(22) Filed: Jun. 3, 2022

(65) Prior Publication Data
US 2022/0392933 A1 Dec. 8, 2022

(30) Foreign Application Priority Data
Jun. 8, 2021 (JP) .................................. 2021-096077

(51) Int. Cl.
*H10F 39/00* (2025.01)
(52) U.S. Cl.
CPC ..... *H10F 39/8023* (2025.01); *H10F 39/8063* (2025.01)

(58) Field of Classification Search
CPC ...... H10F 30/20; H10F 30/21; H10F 39/8023; H10F 39/8063; H10F 39/807; H10K 39/32; H10K 50/858; H10K 59/879; H10K 65/00
See application file for complete search history.

(56) References Cited

U.S. PATENT DOCUMENTS

| | | | |
|---|---|---|---|
| 2015/0346547 A1* | 12/2015 | Wakabayashi | .... G02F 1/133526 349/95 |
| 2018/0269245 A1 | 9/2018 | Mlinar | |
| 2019/0131333 A1 | 5/2019 | Borthakur | |
| 2022/0018992 A1* | 1/2022 | Oya | ....... C08L 101/12 |

FOREIGN PATENT DOCUMENTS

| | | | | |
|---|---|---|---|---|
| JP | 2003218343 A | | 7/2003 | |
| JP | 2007329721 A | | 12/2007 | |
| WO | WO-2021074738 A1 | * | 4/2021 | ............. H10K 30/87 |

* cited by examiner

*Primary Examiner* — Brook Kebede
(74) *Attorney, Agent, or Firm* — Canon U.S.A., Inc. IP Division

(57) ABSTRACT

A photoelectric conversion apparatus includes a plurality of pixels each including a first photoelectric conversion circuit, a second photoelectric conversion circuit, and a divergence optical circuit for diverging incident light. The divergence optical circuit is disposed on a semiconductor substrate where the first photoelectric conversion circuit and the second photoelectric conversion circuit are disposed, and covers at least a part of the first photoelectric conversion circuit in a plan view as viewed from a light incidence side.

20 Claims, 9 Drawing Sheets

PHOTOELECTRIC CONVERSION APPARATUS HAVING DIVERGENCE OPTICAL CIRCUIT, PHOTOELECTRIC CONVERSION SYSTEM, AND MOVING BODY

BACKGROUND

Technical Field

One disclosed aspect of the embodiments relates to a photoelectric conversion apparatus that can obtain a wide dynamic range.

Description of the Related Art

In recent years, there has been a demand for a photoelectric conversion apparatus having a wide dynamic range. An apparatus having a high dynamic range, which can image a dark part and a bright part that cannot be handled by a conventional photoelectric conversion apparatus, can be advantageously utilized in, for example, an on-vehicle camera or a security camera, in a case where the difference between light and dark is large, such as backlight.

The following four documents each discuss a photoelectric conversion apparatus implementing a high dynamic range.

In Japanese Patent Application Laid-Open No. 2003-218343, a plurality of photodiodes varying in sensitivity is formed using the difference between the areas of the respective photodiodes, so that a high dynamic range is implemented.

In Japanese Patent Application Laid-Open No. 2007-329721, a plurality of photodiodes varying in sensitivity is implemented by forming neutral density filters varying in transmission rate on the respective photodiodes.

In each of United States Patent Application Publication Nos. US2018/0269245 and US2019/0131333, a wider dynamic range is obtained by combining a plurality of photodiodes varying in sensitivity with a toroidal microlens or a plurality of spherical microlenses.

SUMMARY

According to an aspect of the embodiments, a photoelectric conversion apparatus includes a plurality of pixels each including a first photoelectric conversion unit, a second photoelectric conversion unit, and a divergence optical circuit for diverging incident light. The divergence optical circuit is disposed on a semiconductor substrate where the first photoelectric conversion unit and the second photoelectric conversion unit are disposed, and covers at least a part of the first photoelectric conversion unit in a plan view as viewed from a light incidence side.

According to another aspect of the embodiments, a photoelectric conversion apparatus includes a plurality of pixels each including a first photoelectric conversion unit, a second photoelectric conversion unit, and a convergence optical circuit for converging incident light. The convergence optical circuit is disposed on a semiconductor substrate where the first photoelectric conversion unit and the second photoelectric conversion unit are disposed, and covers at least a part of the second photoelectric conversion unit in a plan view as viewed from a light incidence side.

According to yet another aspect of the embodiments, a semiconductor substrate stacked on a semiconductor substrate including a wiring layer includes a plurality of pixels each including a first photoelectric conversion unit and a second photoelectric conversion unit, and a convergence optical circuit for converging incident light and covering at least a part of the first photoelectric conversion unit in a plan view.

According to yet another aspect of the embodiments, a semiconductor substrate including a plurality of pixels and a convergence optical circuit for converging incident light. The plurality of pixels each includes a first photoelectric conversion unit and a second photoelectric conversion unit, and wherein the convergence optical circuit covers at least a part of the first photoelectric conversion unit in a plan view.

Further features of the disclosure will become apparent from the following description of exemplary embodiments with reference to the attached drawings.

DESCRIPTION OF THE EMBODIMENTS

Exemplary embodiments of a photoelectric conversion apparatus of the disclosure will be described with reference to the drawings. The disclosure is not limited to these exemplary embodiments.

In each of the exemplary embodiments to be described below, an imaging apparatus will be mainly described as an example of the photoelectric conversion apparatus to which the disclosure is applicable, but the apparatus to which the disclosure is applicable is not limited to the imaging apparatus. The disclosure is applicable to, for example, a ranging apparatus (an apparatus for a purpose such as measuring a distance using focus detection or time of flight (TOF)), and a photometric apparatus (an apparatus for a purpose such as measuring an incident light amount).

A photoelectric conversion apparatus according to a first exemplary embodiment is an imaging apparatus that includes a pixel array unit, a vertical drive unit, a column processing unit, a horizontal drive unit, and a system control unit.

In the pixel array unit, unit pixels are arranged in arrays. The unit pixels each have a photoelectric conversion element that generates electric charges in an amount corresponding to an incident light amount and accumulates the generated electric charges therein. The unit pixel will be hereinafter simply expressed as the pixel, and a configuration of each of the pixels will be described.

Figure 1:
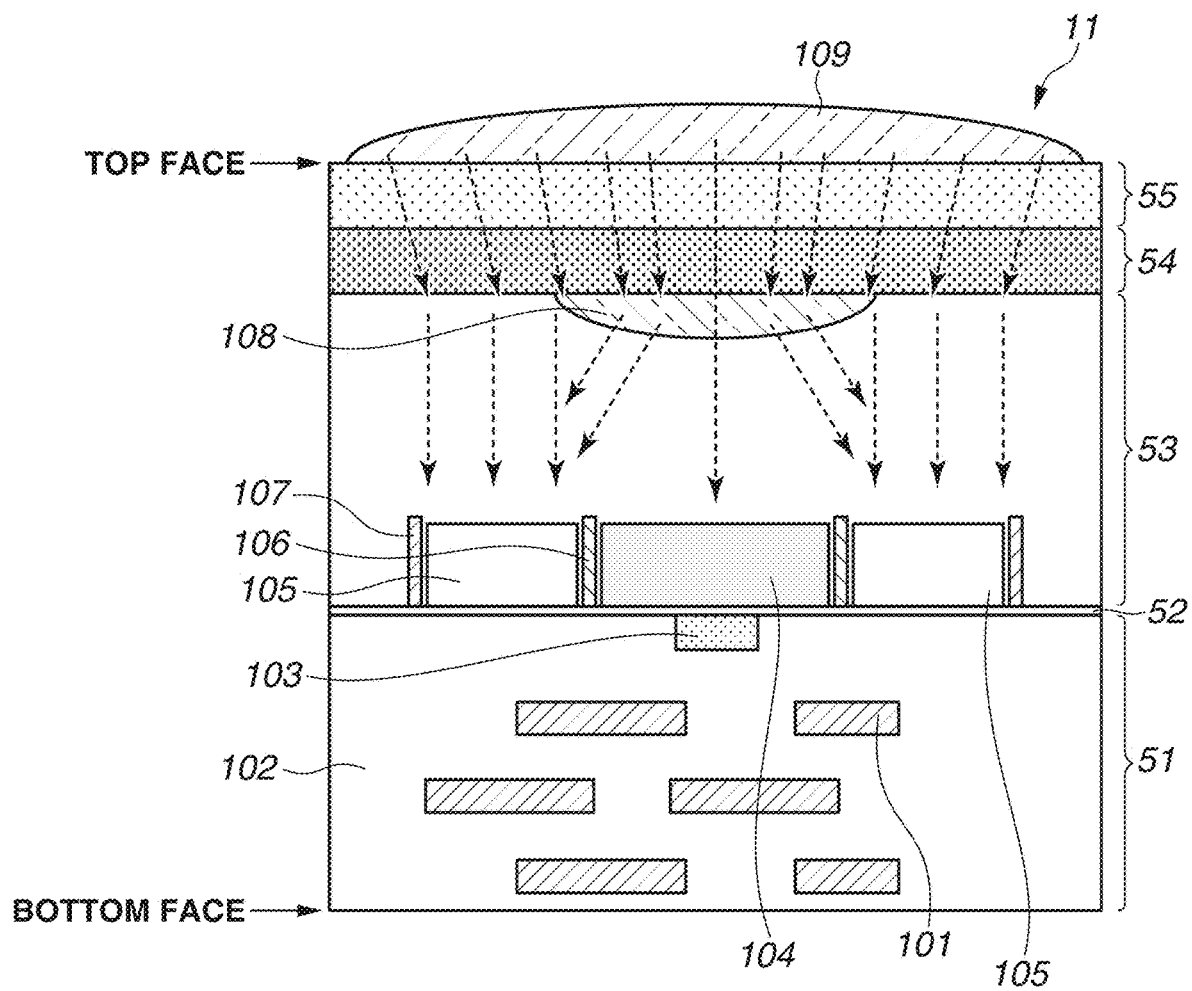
FIG. 1 is a schematic view of a cross-sectional structure of a pixel of a photoelectric conversion apparatus according to a first exemplary embodiment.

FIG. 1 is a schematic cross-sectional view of the pixel of the photoelectric conversion apparatus according to the first exemplary embodiment.

In FIG. 1, a pixel 11 is a pixel of a back-illuminated complementary metal oxide semiconductor (CMOS) image sensor to be irradiated with incident light from the top face in FIG. 1. In the following description, the top face and the bottom face in FIG. 1 are the back surface and the front surface, respectively.

The pixel 11 is formed by stacking a wiring layer 51, an oxide film 52, a semiconductor substrate 53, a dielectric material layer 54, a color filter layer 55, and an on-chip lens 109 in this order from the lower side in FIG. 1.

The wiring layer 51 is formed by embedding a plurality of wires 101 in an interlayer insulation film 102. The wires 101 perform, for example, readout of electric charges accumulated in a first photoelectric conversion unit 104 and a second photoelectric conversion unit 105 formed on the semiconductor substrate 53.

In the wiring layer 51, a transfer gate 103 is disposed on the semiconductor substrate 53 with the oxide film 52 interposed therebetween. The electric charges accumulated in the first photoelectric conversion unit 104 and the second photoelectric conversion unit 105 are transferred by applying a predetermined voltage to the transfer gate 103.

The wiring layer 51 is supported by a substrate supporting member (not illustrated) disposed thereunder. For example, a circuit for reading out electric charges is formed on the wiring layer 51, and signal processing units or circuits, which process signals based on the read-out electric charges and are an analog-to-digital (A/D) converter circuit and components in subsequent stages, are disposed on the substrate supporting member side, so that the image sensor can be driven at a high speed.

The oxide film 52 has an insulation property, and insulates the front surface side of the semiconductor substrate 53.

The semiconductor substrate 53 has the first photoelectric conversion unit or circuit 104, the second photoelectric conversion unit or circuit 105, and an inner lens 108 (hereinafter also referred to as "diverging lens 108") having a concave lens function. The first photoelectric conversion unit 104 and the second photoelectric conversion unit 105 are different in terms of the area of a light incidence surface for receiving incident light, and vary in sensitivity to the incident light. The first photoelectric conversion unit 104 has low sensitivity because the area of the light incidence surface is smaller than that of the second photoelectric conversion unit 105. The second photoelectric conversion unit 105 has high sensitivity because the area of the light incidence surface is larger than that of the first photoelectric conversion unit 104. Therefore, the second photoelectric conversion unit 105 is disposed to surround the first photoelectric conversion unit 104.

Each of the first photoelectric conversion unit 104 and the second photoelectric conversion unit 105 is an element having a PN-junction type photodiode structure or an element having a single photon avalanche diode (SPAD) structure, but is not limited to these elements.

The diverging lens 108 has a structure or optical circuit in which a convex portion having a convex sphere is formed by hollowing a part of the semiconductor substrate 53 and filling the convex portion with the dielectric material layer 54. In general, a dielectric material layer is formed of an organic material.

For example, in a case where Si having a refractive index of about 3.4 is used for the semiconductor substrate 53 and the refractive index of the dielectric material layer 54 to fill is about 1.5, a diverging lens having a large divergence angle can be formed by the refractive index difference between the semiconductor substrate 53 and the dielectric material layer 54. In place of the dielectric material layer, a layer of $SiO_2$, SiN, or the like may be used to form the diverging lens 108 (to fill the convex portion), or the diverging lens 108 may have a Fresnel lens structure instead of having an ordinary spherical lens structure. The thickness of the lens can be reduced by providing the diverging lens 108 having the Fresnel lens structure.

In a plan view of the semiconductor substrate 53 viewed from the light incidence side, the diverging lens 108 is disposed to cover at least the first photoelectric conversion unit 104, of the first photoelectric conversion unit 104 and the second photoelectric conversion unit 105. The first photoelectric conversion unit 104 is covered by the diverging lens 108, so that light incident on the apparatus and coming toward the first photoelectric conversion unit 104 is diverged by the diverging lens 108, and a part of the light is directed toward and then incident on a portion (for example, the second photoelectric conversion unit 105) other than the first photoelectric conversion unit 104. The light incident on the first photoelectric conversion unit 104 can be therefore reduced as compared with a case where the diverging lens 108 does not intervene. As a result, the sensitivity difference between the first photoelectric conversion unit 104 and the second photoelectric conversion unit 105 can be increased, so that the dynamic range can be further increased.

The pixel array unit in which the unit pixels are arranged has an optical black (OB) pixel and a reference pixel in addition to the unit pixels.

The OB pixel has the same element structure as that of the unit pixel, but a light blocking portion (not illustrated) for limiting the incidence of light is disposed on the light incidence surface side. Therefore, photoelectric conversion of the incident light does not occur in the photoelectric conversion unit or circuit of the OB pixel, and the reference value of a black level including a dark current and noise of the photoelectric conversion unit can be obtained as the output of the OB pixel.

The reference pixel is different from the unit pixel and the OB pixel in that no photoelectric conversion unit is formed. Because no photoelectric conversion unit is formed, a signal output from the reference pixel is affected by neither a dark current nor noise of a photoelectric conversion unit. The reference value of noise of the pixel unit including neither a dark current nor noise of a photoelectric conversion unit can be obtained as the output of the reference pixel.

Figure 2:
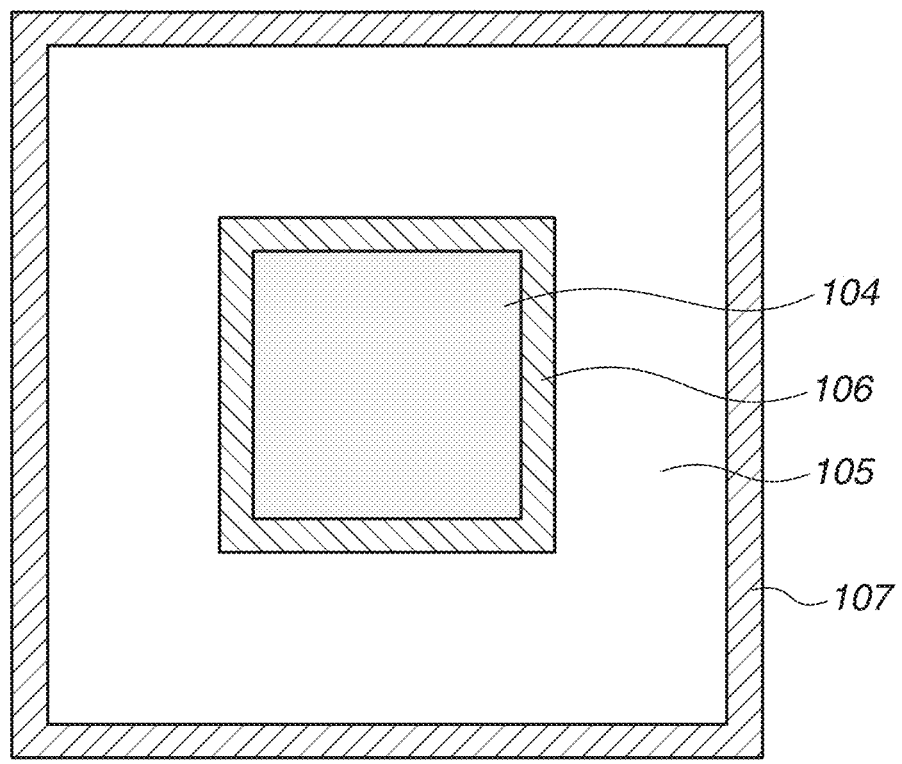
FIG. 2 is a schematic plan view of the pixel of the photoelectric conversion apparatus according to the first exemplary embodiment.

FIG. 2 is a schematic plan view of the first photoelectric conversion unit 104 and the second photoelectric conversion unit 105 of the pixel according to the first exemplary embodiment, as viewed from the back surface side of the semiconductor substrate 53.

Figure 3A:
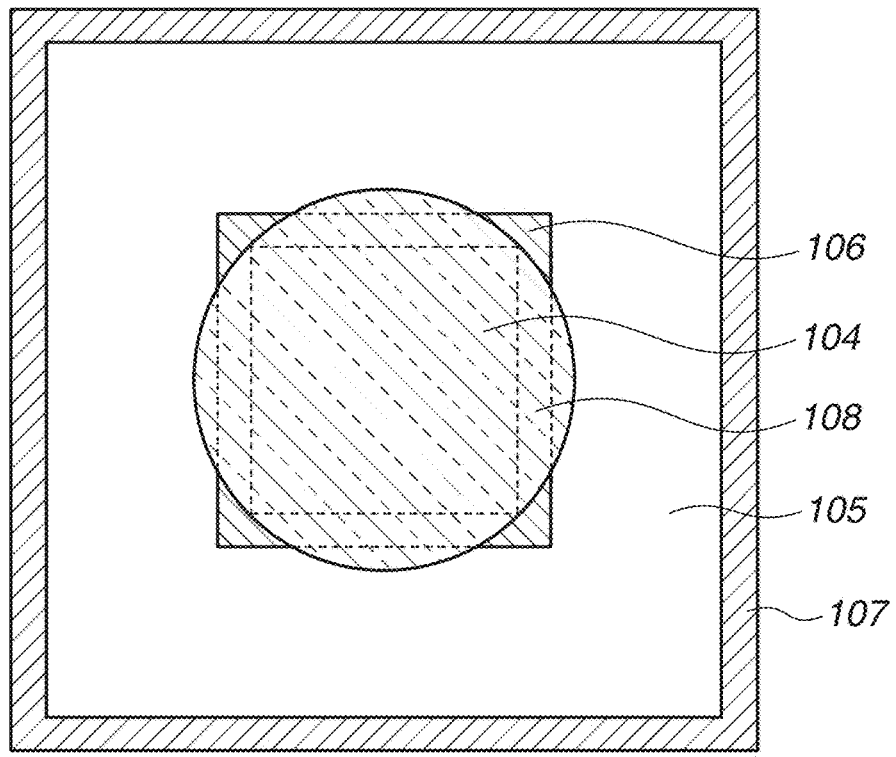
FIGS. 3A and 3B are schematic plan views of the pixel of the photoelectric conversion apparatus according to the first exemplary embodiment.
Figure 3B:
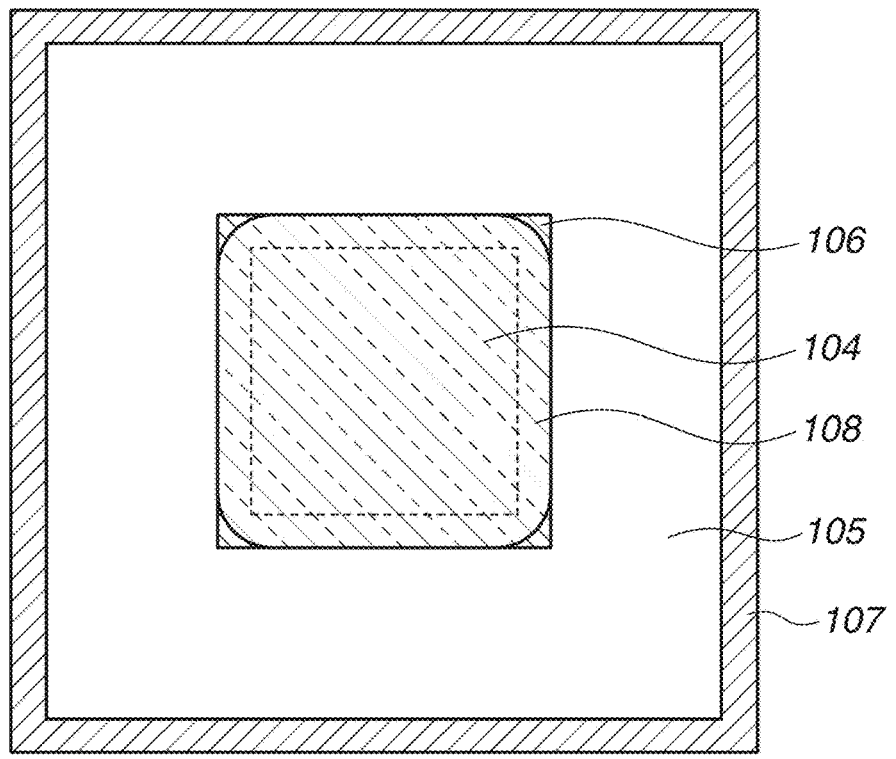

FIGS. 3A and 3B are both schematic plan views of the first photoelectric conversion unit 104, the second photoelectric conversion unit 105, and the diverging lens 108 of the pixel according to the first exemplary embodiment, as viewed from the back surface side of the semiconductor substrate 53.

As illustrated in FIGS. 3A and 3B, the shape of the diverging lens 108 in the plan view is not limited to a circle, and can be a rectangle or other shape. The present exemplary embodiment employs a form in which the diverging lens 108 covers the entire (whole) first photoelectric conversion unit 104 in the plan view. However, a form in which the diverging lens 108 covers a large part of the first photoelectric conversion unit 104 including a central portion thereof but not covering a peripheral portion thereof, i.e., covers a part of the first photoelectric conversion unit 104, in the plan view may be adopted.

A form in which the diverging lens 108 covers the entire first photoelectric conversion unit 104 and a part of the second photoelectric conversion unit 105 in the plan view may also be adopted. In a case where the form in which the diverging lens 108 covers a part of the second photoelectric conversion unit 105 is adopted, the diverging lens 108 does not cover a large part of the second photoelectric conversion unit 105.

As described above, the first photoelectric conversion unit 104 is disposed at the central portion of the pixel, and the second photoelectric conversion unit 105 is disposed at the peripheral portion of the pixel, i.e., a nested structure in which one surrounds the other is formed. It is desirable to arrange the first photoelectric conversion unit 104 and the second photoelectric conversion unit 105 so that the respective central portions of gravity are aligned. In such an arrangement, in signal correction when increasing the dynamic range using a signal based on electric charges photoelectrically converted by the first photoelectric conversion unit 104 and a signal based on electric charges photoelectrically converted by the second photoelectric conversion unit 105, it is not necessary to consider misalignment between the photoelectric conversion units in terms of the center of gravity. In other words, the signal correction is easy.

In the present exemplary embodiment, the first photoelectric conversion unit 104 and the second photoelectric conversion unit 105 each include one photoelectric conversion unit, but may each include a plurality of photoelectric conversion units combined. In this case, the area of the light incidence surface of each of the first photoelectric conversion unit 104 and the second photoelectric conversion unit 105 is the sum of the areas of the light incidence surfaces of the respective plurality of photoelectric conversion units.

In the present exemplary embodiment, the diverging lens 108 increases the sensitivity difference between the first photoelectric conversion unit 104 and the second photoelectric conversion unit 105 varying in sensitivity to light depending on the area of the light incidence surface. However, also for, for example, the first and second photoelectric conversion units that are equal in terms of the area of the light incidence surface and comparable in terms of sensitivity to light, the sensitivity difference can be provided by the diverging lens for covering the photoelectric conversion unit.

In the present exemplary embodiment, the diverging lens 108 is formed in the semiconductor substrate 53. However, it is also possible to form, for example, an inner lens (diverging lens) having a concave lens function, in the dielectric material layer 54 formed on the light incidence surface side of the semiconductor substrate 53.

In the semiconductor substrate 53, a first light blocking wall 106 for blocking light is formed between the first photoelectric conversion unit 104 and the second photoelectric conversion unit 105, and further, a second light blocking wall 107 for blocking light is formed between adjacent pixels. The first light blocking wall 106 and the second light blocking wall 107 are each formed of a material having a light blocking property, such as $Al_2O_3$ or W.

The first light blocking wall 106 can effectively prevent the occurrence of crosstalk of light between the first photoelectric conversion unit 104 and the second photoelectric conversion unit 105.

The second light blocking wall 107 can prevent the occurrence of crosstalk of light between the pixels. In this case, for the second photoelectric conversion units 105 of the respective two adjacent pixels, the occurrence of crosstalk of light is prevented by the two second light blocking walls 107 located therebetween.

In a case where a position at which the second photoelectric conversion unit 105 is disposed is near the second photoelectric conversion unit 105 of an adjacent pixel, the one second light blocking wall 107 may be disposed for the second photoelectric conversion units 105 of the respective two pixels adjacent to each other.

A separation portion by a potential barrier for limiting the movement of electric charges accumulated in the photoelectric conversion unit may be formed of an impurity diffusion layer, and the photoelectric conversion units may be thereby separated. The occurrence of crosstalk of the electric charges can be prevented by forming such a separation portion.

Figure 4:
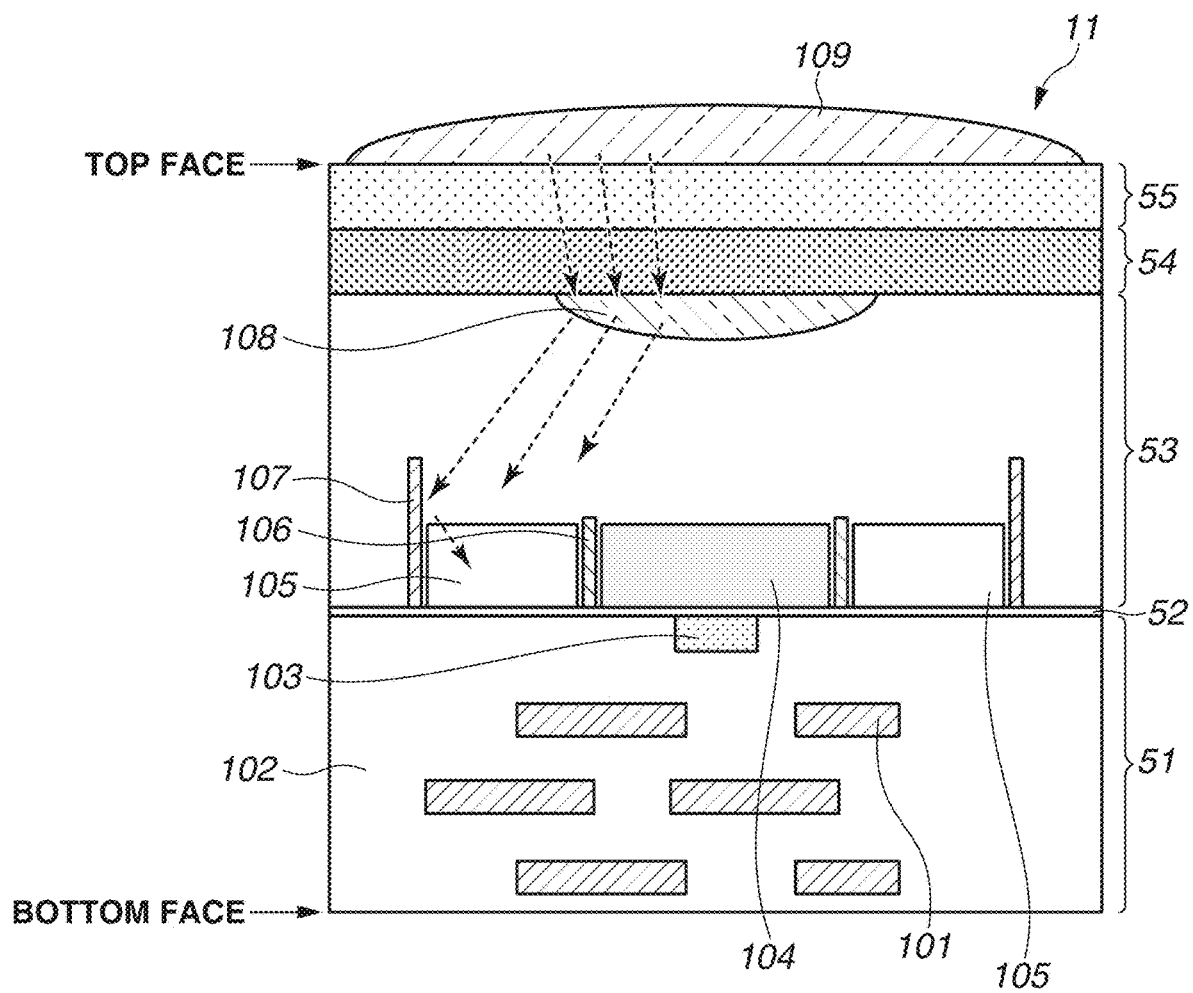
FIG. 4 is a schematic cross-sectional view of the pixel of the photoelectric conversion apparatus according to the first exemplary embodiment.

FIG. 4 is a diagram illustrating a modification of the first exemplary embodiment, and is a schematic cross-sectional view of the pixel of the photoelectric conversion apparatus.

In the pixel illustrated in FIG. 4, the height of the second light blocking wall 107 is greater than the height of the first light blocking wall 106, unlike the pixel illustrated in FIG. 1. Light diverged by the inner lens 108 (the diverging lens 108) having a concave lens function and obliquely incident light are thereby reflected by the second light blocking wall 107, so that the occurrence of crosstalk of light between the pixels can be prevented more effectively.

The height of the light incidence surface of the second photoelectric conversion unit 105 can also be greater than the height of the light incidence surface of the first photoelectric conversion unit 104 to match with the height of the second light blocking wall 107. The height of the wall 107 is determined so that it can effectively block substantially the light diverging from the lens 108. The sensitivity of the second photoelectric conversion unit 105 is thereby increased, so that the sensitivity difference between the first photoelectric conversion unit 104 and the second photoelectric conversion unit 105 can be increased.

According to the first exemplary embodiment and the modification thereof, a divergence structure or optical circuit for diverging the incident light overlaps one or some of the plurality of photoelectric conversion units, so that the light incident on some of the pixels can be reduced, and the sensitivity difference between the plurality of photoelectric conversion units can be provided.

In the present exemplary embodiment, the photoelectric conversion apparatus is described to have the plurality of photoelectric conversion units varying in the area of the light incidence surface of the photoelectric conversion unit and varying in the sensitivity, and a similar photoelectric conversion apparatus will also be described in each of exemplary embodiments to be described below. However, the disclosure is also applicable to a photoelectric conversion apparatus having a plurality of photoelectric conversion units that are made to vary in sensitivity by making the impurity concentrations of the semiconductor regions of the respective photoelectric conversion units different from each other. The disclosure is also applicable to a photoelectric conversion apparatus having a plurality of photoelectric conversion units made to vary in sensitivity by covering the light incidence surfaces of the respective photoelectric conversion units with neutral density filters varying in transmission rate.

Figure 5:
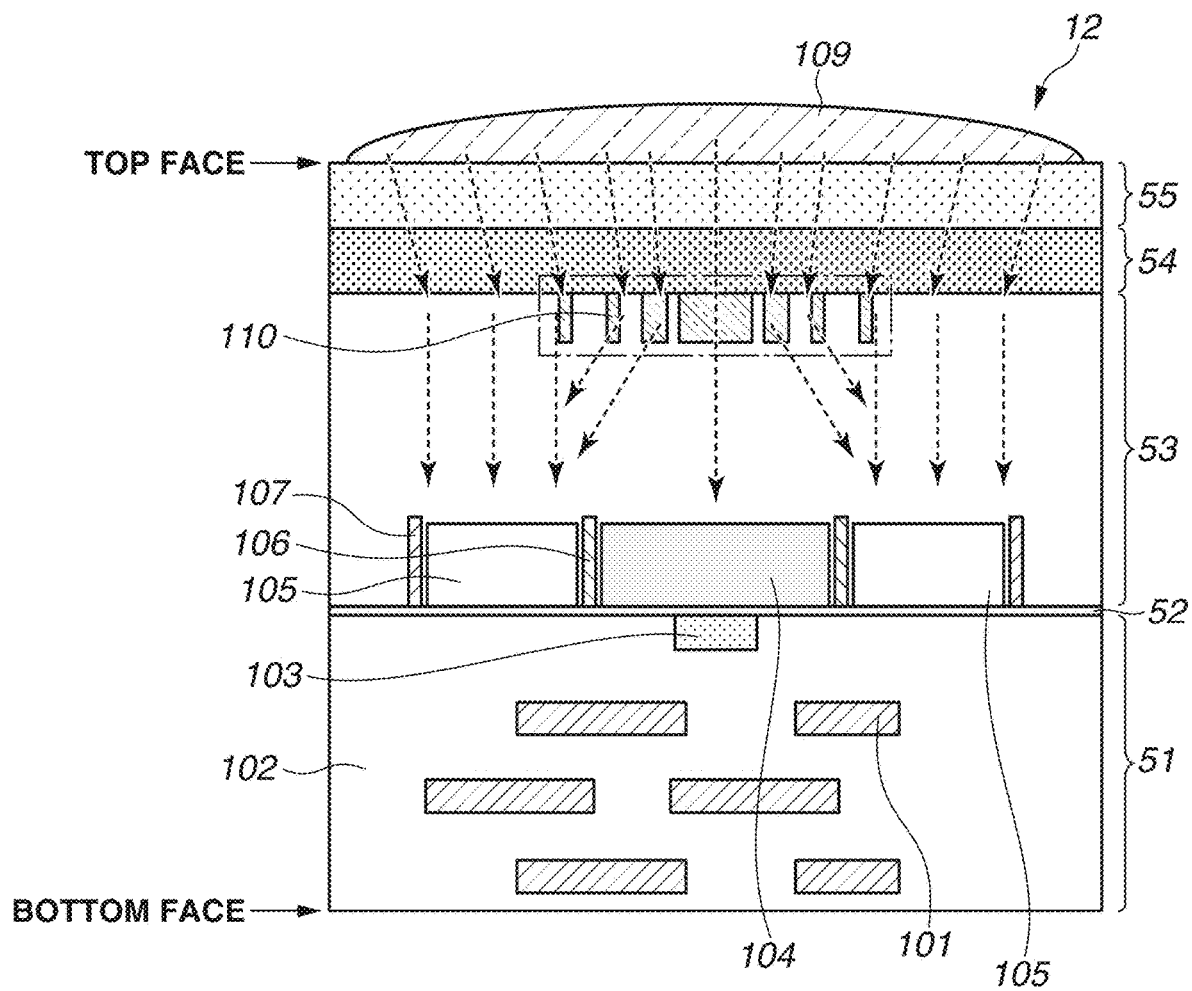
FIG. 5 is a schematic cross-sectional view of a pixel of a photoelectric conversion apparatus according to a second exemplary embodiment.

FIG. 5 is a schematic cross-sectional view of a pixel of a photoelectric conversion apparatus according to a second exemplary embodiment. The present exemplary embodiment is different from the first exemplary embodiment in terms of the configuration of an inner lens having a concave lens function. In the following description, a description common to the first exemplary embodiment will be omitted, and a description different from the first exemplary embodiment will be mainly provided.

In FIG. 5, a pixel 12 is a pixel of a back-illuminated CMOS image sensor, and includes a wiring layer 51, an oxide film 52, a semiconductor substrate 53, a dielectric material layer 54, a color filter layer 55, and an on-chip lens 109 stacked in this order from the lower side in FIG. 5.

The configuration of each of the wiring layer 51 and the oxide film 52 is similar to that of the first exemplary embodiment.

A first photoelectric conversion unit 104, a second photoelectric conversion unit 105, and a flat lens 110 having a function of a concave lens are formed on the semiconductor substrate 53. The flat lens 110 of the present exemplary embodiment is a flat diverging lens, and this is a lens formed by generating non-uniform refractive index distribution based on a periodic structure of a sub-wavelength region within a substrate. The sub-wavelength region is a region having a size about the same as or smaller than the wavelength of light (in the present exemplary embodiment, incident light). To implement such a periodic structure, a plurality of grooves is formed in the lens. As a major groove shape of such a lens, structures called a blazed type, a sine wave type, and a laminar type may be used.

The flat lens 110 is produced by forming a plurality of grooves each having a width smaller than the wavelength of incident light in the semiconductor substrate 53, and the dielectric material layer 54 fills the grooves. For example, Si having a refractive index of about 3.4 is used for the semiconductor substrate 53, and in a case where the dielectric material layer 54 having a refractive index of about 1.5 fills the plurality of grooves, Si and a dielectric material that vary in refractive index are alternately arranged in the semiconductor substrate 53.

The flat lens 110 having a concave lens function can be formed by making the average refractive index of the peripheral region of the flat lens 110 higher than the average refractive index of the central region. Specifically, the ratio of a low refractive index structure placed in the central region is higher than the ratio of a low refractive index structure placed in the peripheral region, and conversely, the ratio of a high refractive index structure placed in the peripheral region is higher than the ratio of a high refractive index structure placed in the central portion, so that there is a difference in average refractive index. The average refractive index is a value calculated by the volume ratio between the high refractive index structure and the low refractive index structure.

SiO$_2$, SiN, or the like may be used in place of the organic dielectric material.

The flat lens 110 is disposed to cover at least one of the first photoelectric conversion unit 104 and the second photoelectric conversion unit 105. The incident light is diverged by the flat lens 110 by disposing the flat lens 110 to cover the first photoelectric conversion unit 104, so that the light incident on the first photoelectric conversion unit 104 can be reduced. As a result, the sensitivity difference between the first photoelectric conversion unit 104 and the second photoelectric conversion unit 105 can be increased, and the dynamic range is further increased.

Figure 6:
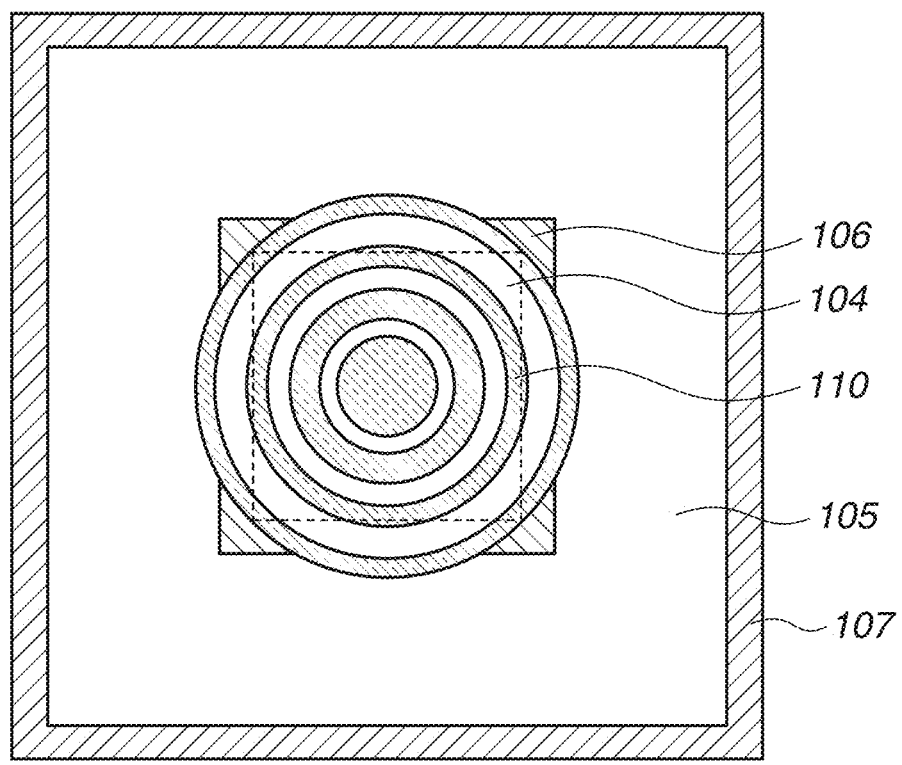
FIG. 6 is a schematic plan view of the pixel of the photoelectric conversion apparatus according to the second exemplary embodiment.

FIG. 6 is a schematic plan view of the first photoelectric conversion unit 104, the second photoelectric conversion unit 105, and the flat lens 110 of the pixel according to the second exemplary embodiment, as viewed from the back surface of the semiconductor substrate 53.

In FIG. 6, the first photoelectric conversion unit 104 and the second photoelectric conversion unit 105 are arranged like a nest so that the respective centers of gravity are aligned, and further, the flat lens 110 is disposed so that the center of gravity (optical axis) thereof is also aligned with the center of gravity of each of the first photoelectric conversion unit 104 and the second photoelectric conversion unit 105. In such an arrangement, in signal correction when increasing the dynamic range using a signal based on electric charges converted by the first photoelectric conversion unit 104 and a signal based on electric charges converted by the second photoelectric conversion unit 105, it is not necessary to consider misalignment between the photoelectric conversion units in terms of the center of gravity. In other words, the signal correction is easy.

In the present exemplary embodiment, a light blocking wall for preventing crosstalk of light between adjacent pixels or a separation portion by a potential barrier to prevent crosstalk of signal charges between adjacent pixels may be formed, as with the first exemplary embodiment.

The heights of the light blocking walls may vary depending on the positions where the light blocking walls are disposed, or the heights of the light incidence surfaces of the photoelectric conversion units may vary depending on the heights of the light blocking walls, as with the first exemplary embodiment.

In this way, a divergence structure such as the diverging lens overlaps a part of the plurality of photoelectric conversion units in the plan view, so that the sensitivity difference between the plurality of photoelectric conversion units can be provided.

Figure 7:
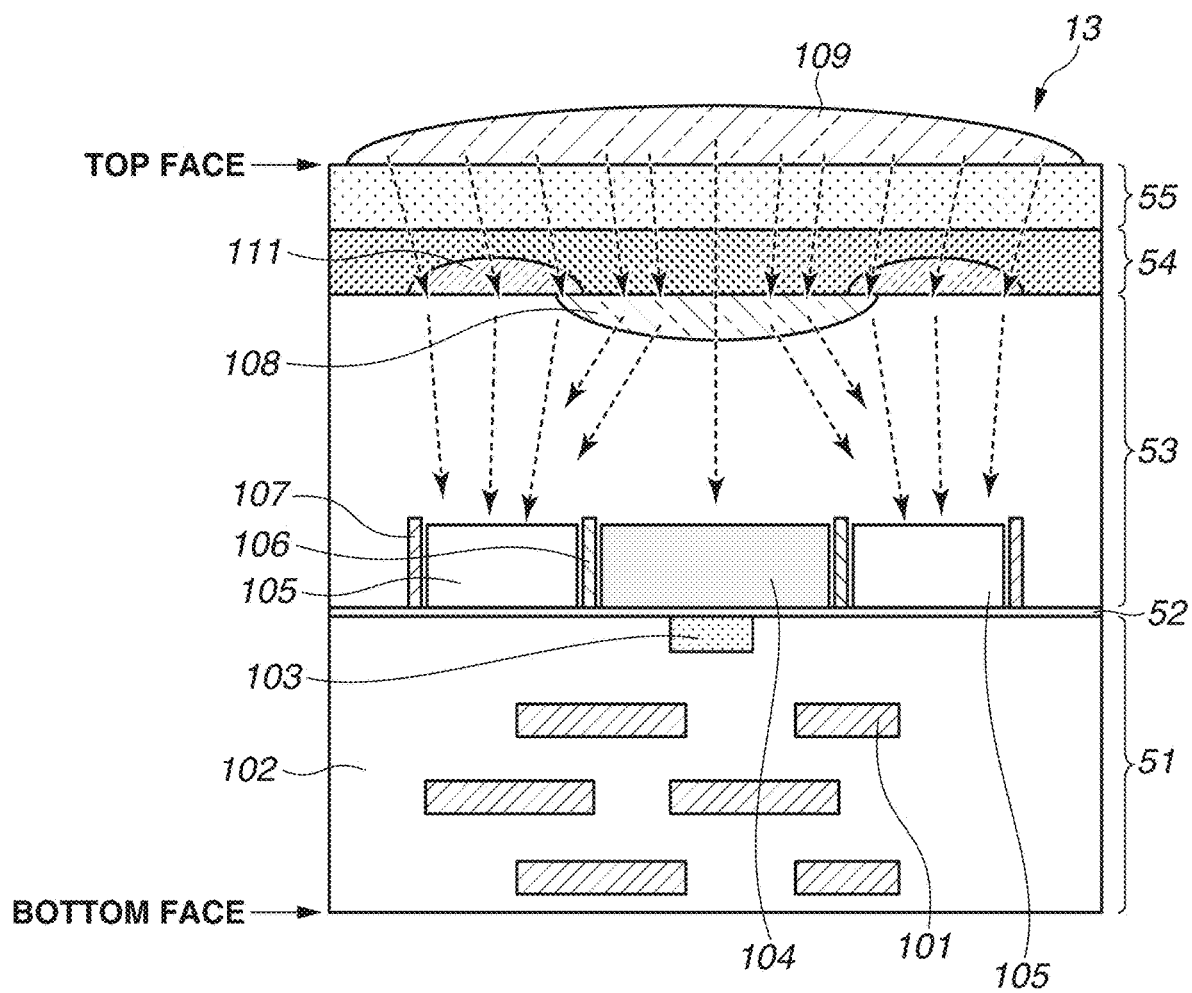
FIG. 7 is a schematic cross-sectional view of a pixel of a photoelectric conversion apparatus according to a third exemplary embodiment.

FIG. 7 is a schematic cross-sectional view of a pixel of a photoelectric conversion apparatus according to a third exemplary embodiment.

The present exemplary embodiment describes a configuration in which a convex lens for condensing light onto a second photoelectric conversion unit is disposed, in addition to a concave lens disposed in a pixel central portion to reduce light incident on a first photoelectric conversion unit. In the following description, a part overlapping the description of the first and second exemplary embodiments will be omitted, and a part different from the first and second exemplary embodiments will be mainly described.

In FIG. 7, a pixel 13 is a pixel of a back-illuminated CMOS image sensor, and a wiring layer 51, an oxide film 52, a semiconductor substrate 53, a dielectric material layer 54, a color filter layer 55, and an on-chip lens 109 are laminated in this order from the lower side in FIG. 7.

The configuration of each of the wiring layer 51 and the oxide film 52 is similar to that of the first exemplary embodiment.

A first photoelectric conversion unit 104, a second photoelectric conversion unit 105, an inner lens 108 (a diverging lens 108) having a concave lens function, and an inner lens 111 (hereinafter also referred to as "converging lens 111") having a convex lens function are formed on the semiconductor substrate 53.

The configuration of the diverging lens 108 is similar to that in the first exemplary embodiment, and the diverging lens 108 diverges incident light.

In the present exemplary embodiment, in addition to the diverging lens 108, the converging lens 111 for converging the incident light to the back surface side of the semiconductor substrate 53 is formed. The converging lens 111 converges the incident light on the second photoelectric conversion unit 105. The converging lens 111 is formed of, for example, SiN, SiO₂, or the like having a refractive index higher than that of the dielectric material layer 54.

The diverging lens 108 is disposed to cover the first photoelectric conversion unit 104, and the converging lens 111 is disposed to cover the second photoelectric conversion unit 105. With such an arrangement, light incident on a pixel central portion corresponding to the first photoelectric conversion unit 104 is diverged by the diverging lens 108, so that light incident on the first photoelectric conversion unit 104 decreases. Further, light incident on a pixel peripheral portion corresponding to the second photoelectric conversion unit 105 is converged by the converging lens 111, so that light incident on the second photoelectric conversion unit 105 can be increased. As a result, the sensitivity difference between the first photoelectric conversion unit 104 and the second photoelectric conversion unit 105 can be provided, and the dynamic range is increased.

In the present exemplary embodiment as well, a light blocking wall for preventing crosstalk of light between adjacent pixels or a separation portion by a potential barrier to prevent crosstalk of signal charges between adjacent pixels may be formed as with the first exemplary embodiment.

The heights of the light blocking walls may vary depending on the positions where the light blocking walls are disposed, or the heights of the light incidence surfaces of the photoelectric conversion units may vary depending on the heights of the light blocking walls, as with the first exemplary embodiment.

In this way, each of the plurality of photoelectric conversion units is disposed to be covered by the corresponding one of a divergence structure such as the diverging lens and a convergence structure or optical circuit such as the converging lens, so that the sensitivity difference between the plurality of photoelectric conversion units can be provided.

Figure 8:
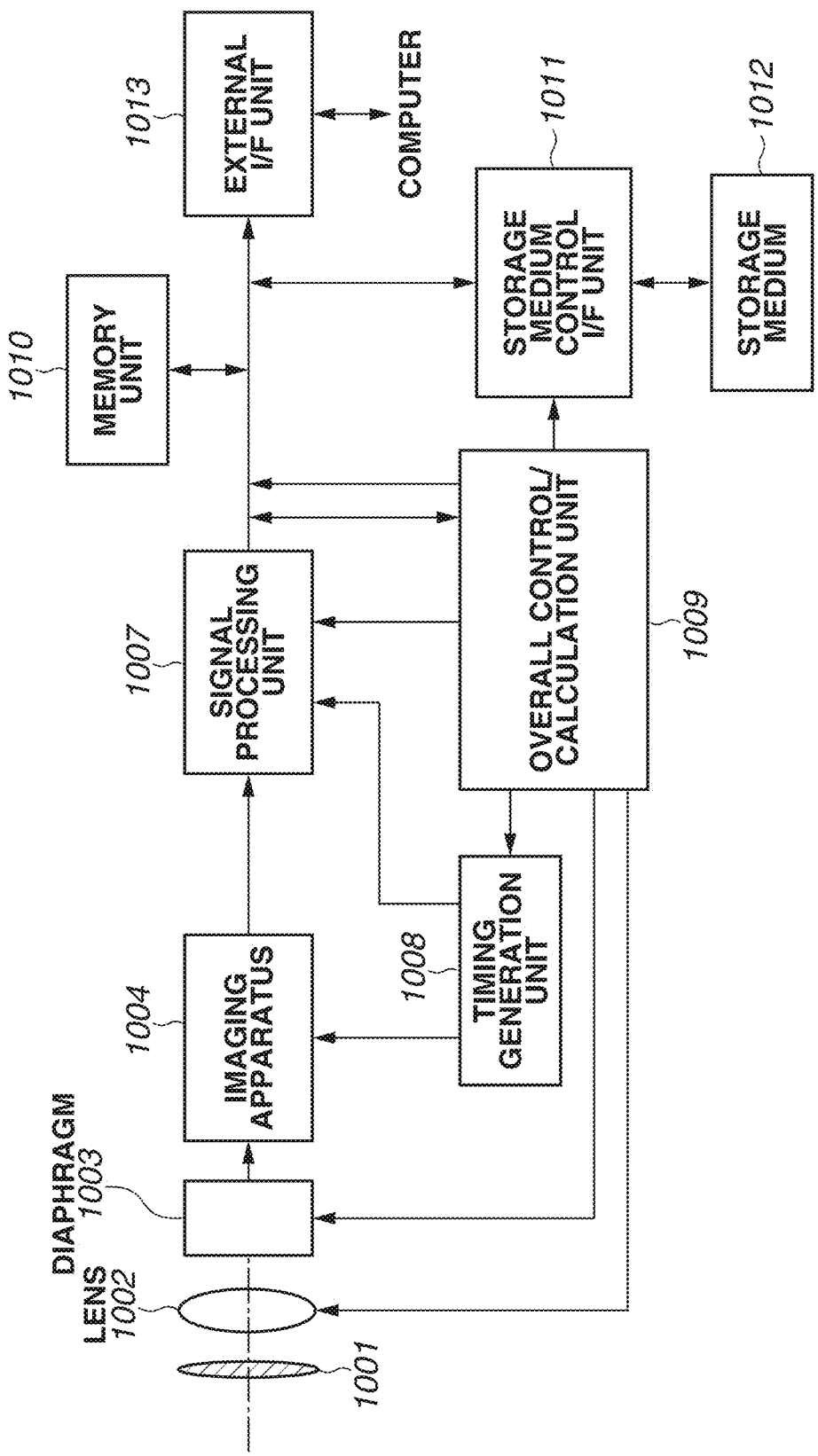
FIG. 8 is a diagram illustrating a configuration of a photoelectric conversion system according to a fourth exemplary embodiment.

A photoelectric conversion system according to a fourth exemplary embodiment will be described with reference to FIG. 8. FIG. 8 is a block diagram illustrating a schematic configuration of the photoelectric conversion system according to the present exemplary embodiment.

The photoelectric conversion apparatus (the imaging apparatus) described in each of the first to third exemplary embodiments is applicable to various types of photoelectric conversion system. Examples of the photoelectric conversion system to which the photoelectric conversion apparatus is applicable include a digital still camera, a digital camcorder, a surveillance camera, a copier, a facsimile, a mobile phone, an on-vehicle camera, and an observation satellite. A camera module including an optical system such as a lens and an imaging apparatus is also included in the examples of the photoelectric conversion system. FIG. 8 is a block diagram illustrating a digital still camera as one of these examples.

The photoelectric conversion system illustrated in FIG. 8 has an imaging apparatus 1004 serving as an example of the photoelectric conversion apparatus described in each of the first to third exemplary embodiments, and a lens 1002 that forms an optical image of an object on the imaging apparatus 1004. The photoelectric conversion system further has a diaphragm 1003 for making the amount of light passing through the lens 1002 variable, and a barrier 1001 for protecting the lens 1002. The lens 1002 and the diaphragm 1003 serve as an optical system or assembly that condenses light onto the imaging apparatus 1004. The imaging apparatus 1004 is the photoelectric conversion apparatus (the imaging apparatus) according to any one of the above-described exemplary embodiments, and converts the optical image formed by the lens 1002 into an electric signal.

The photoelectric conversion system has a signal processing unit or circuit 1007 serving as an image generation unit that generates an image by processing an output signal output from the imaging apparatus 1004. The signal processing unit 1007 performs operations of executing various corrections and compression where appropriate and outputting image data. The signal processing unit 1007 may be formed on a semiconductor substrate provided with the imaging apparatus 1004, or may be formed on a semiconductor substrate different from that of the imaging apparatus 1004.

The photoelectric conversion system further has a memory unit or circuit 1010 for temporarily storing image data, an external interface unit or circuit (an external I/F unit) 1013 for communicating with an external computer or the like. The photoelectric conversion system further has a storage medium or circuit 1012 such as a semiconductor memory for recording or reading out image data, and a storage medium control interface unit (a storage medium control I/F unit) 1011 for recording in or readout from the storage medium 1012. The storage medium 1012 may be built in the photoelectric conversion system, or may be detachably attached thereto.

The photoelectric conversion system further has an overall control/calculation unit or circuit 1009 that controls various calculations and the entire digital still camera, and a timing generation unit 1008 that outputs various timing signals to the imaging apparatus 1004 and the signal processing unit 1007. The timing signals and the like may be input from outside, and the photoelectric conversion system may have at least the imaging apparatus 1004 and the signal processing unit 1007 that processes an output signal output from the imaging apparatus 1004.

The imaging apparatus 1004 outputs a signal (an imaging signal) generated by photoelectrically converting an optical image, to the signal processing unit 1007. The signal processing unit 1007 performs predetermined signal processing for the imaging signal output from the imaging apparatus 1004, and outputs image data. The signal processing unit 1007 generates an image, using the imaging signal.

In this way, according to the present exemplary embodiment, the photoelectric conversion system to which the photoelectric conversion apparatus (the imaging apparatus) according to any one of the above-described exemplary embodiments is applied can be implemented.

Figure 9A:
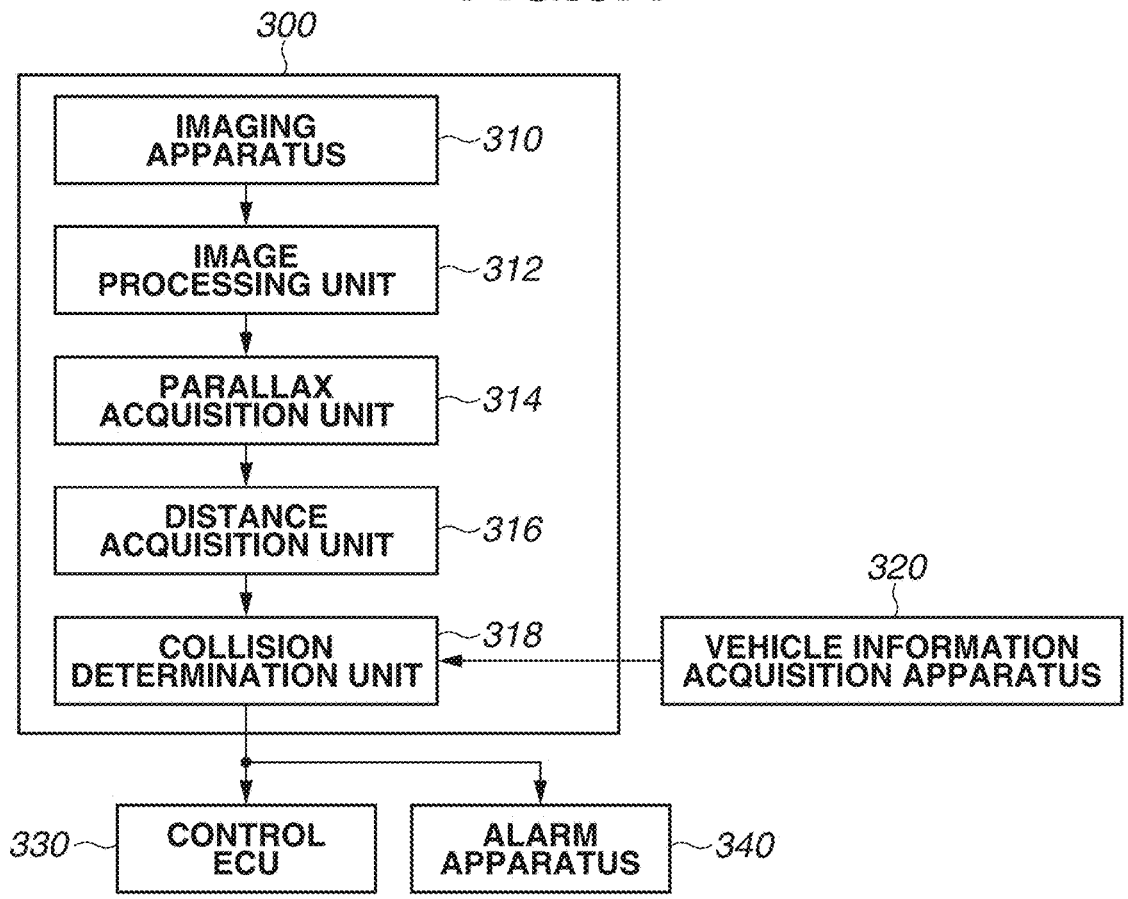
FIGS. 9A and 9B are diagrams illustrating a configuration and an operation of a moving body according to a fifth exemplary embodiment.
Figure 9B:
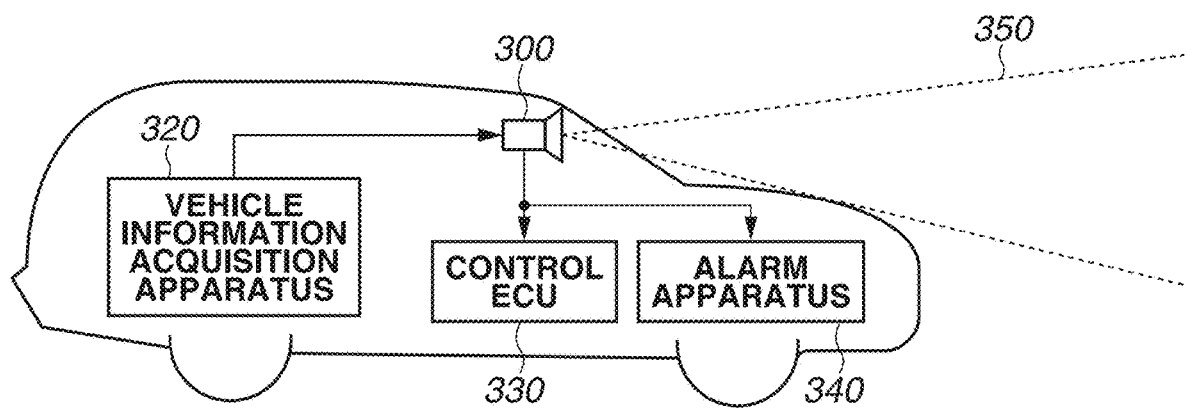

A photoelectric conversion system and a moving body according to a fifth exemplary embodiment will be described with reference to FIGS. 9A and 9B. FIGS. 9A and 9B are diagrams illustrating a configuration of the photoelectric conversion system and a configuration of the moving body according to the present exemplary embodiment, respectively.

FIG. 9A illustrates an example of a photoelectric conversion system for an on-vehicle camera. A photoelectric conversion system 300 has an imaging apparatus 310. The imaging apparatus 310 is the photoelectric conversion apparatus (the imaging apparatus) according to any one of the above-described exemplary embodiments. The photoelectric conversion system 300 has an image processing unit or circuit 312 that performs image processing on a plurality of image data acquired by the imaging apparatus 310, and a parallax acquisition unit or circuit 314 that calculates a parallax (a phase difference of parallax image) from the plurality of image data acquired by the photoelectric conversion system 300. The photoelectric conversion system 300 has a distance acquisition unit or circuit 316 that calculates a distance to a target object based on the calculated parallax, and a collision determination unit or circuit 318 that determines whether there is a collision possibility based on the calculated distance. The parallax acquisition unit 314 and the distance acquisition unit 316 are an example of a distance information acquisition unit that acquires distance information indicating a distance to a target object. In other words, the distance information is information about a parallax, a defocus amount, a distance to a target object, and the like. The collision determination unit 318 may determine the collision possibility, using any one of these pieces of distance information. The distance information acquisition unit may be implemented by dedicatedly designed hardware, or may be implemented by a software module. The distance information acquisition unit may be implemented by a field programmable gate array (FPGA), an application specific integrated circuit (ASIC), or the like, or may be implemented by the combination thereof.

The photoelectric conversion system 300 is connected to a vehicle information acquisition apparatus 320, and can acquire vehicle information such as a vehicle speed, a yaw rate, and a steering angle. The photoelectric conversion system 300 is connected to a control electronic control unit (ECU) or circuit 330, which is a control apparatus that outputs a control signal for causing a vehicle to generate braking force, based on a determination result obtained by the collision determination unit 318. The photoelectric conversion system 300 is also connected to an alarm apparatus 340 that issues an alarm to a driver, based on the determination result obtained by the collision determination unit 318. For example, in a case where the collision possibility is high according to the determination result obtained by the collision determination unit 318, the control ECU 330 controls the vehicle to avoid a collision or reduce damage by, for example, applying a brake, releasing an accelerator, or suppressing an engine output. The alarm apparatus 340 warns a user by, for example, giving an alarm such as sound, displaying alarming information on a screen of a car navigation system or the like, or producing vibrations in a seat belt or a steering wheel.

In the present exemplary embodiment, an area around the vehicle, e.g., a front area or a rear area, is imaged by the photoelectric conversion system 300. FIG. 9B illustrates the photoelectric conversion system in a case where the front area (an imaging range 350) of the vehicle is imaged. The vehicle information acquisition apparatus 320 transmits an instruction to the photoelectric conversion system 300 or the imaging apparatus 310. Such a configuration can further improve the accuracy of ranging.

The example of the control for not colliding with another vehicle is described above, but the present exemplary embodiment is also applicable to automatic driving control for following another vehicle, automatic driving control for not deviating from a lane, and the like. Furthermore, the photoelectric conversion system is not limited to the vehicle such as the vehicle of this system, and can be applied to, for example, a moving body (a moving apparatus) such as a ship, an airplane, or an industrial robot. In addition, the photoelectric conversion system is not limited to the moving body, and can be widely applied to an apparatus that uses object recognition, such as an intelligent transport system (ITS).

Modified exemplary embodiments will be described. The disclosure is not limited to the above-described exemplary embodiments, and can be modified in various ways.

For example, an example in which a partial configuration of any one of the exemplary embodiments is added to another exemplary embodiment, and an example in which the partial configuration is replaced with a partial configuration of another exemplary embodiment, are also included in the exemplary embodiments of the disclosure.

The photoelectric conversion system according to each of the fourth exemplary embodiment illustrated in FIG. 8 and the fifth exemplary embodiment illustrated in FIG. 9A is an example of the photoelectric conversion system to which the photoelectric conversion apparatus can be applied. The photoelectric conversion system to which the photoelectric conversion apparatus according to each of the exemplary embodiments of the disclosure can be applied is not limited to the configuration illustrated in each of FIG. 8 and FIG. 9A.

The above-described exemplary embodiments are merely examples of an embodiment for implementing the disclosure, and the technical scope of the disclosure is not to be interpreted as being limited by these exemplary embodiments. In other words, the disclosure can be carried out in various forms without departing from the technical idea of the disclosure or main features thereof.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-096077, filed Jun. 8, 2021, which is hereby incorporated by reference herein in its entirety.

What is claimed is:

1. A photoelectric conversion apparatus comprising:
a plurality of pixels each including a first photoelectric conversion circuit, a second photoelectric conversion circuit, and a diverging lens for diverging incident light,
wherein the diverging lens is disposed on a semiconductor substrate where the first photoelectric conversion circuit and the second photoelectric conversion circuit are disposed, and covers at least a part of the first photoelectric conversion circuit in a plan view as viewed from a light incidence side, and
wherein the first photoelectric conversion circuit and the second photoelectric conversion circuit are different in sensitivity to incident light.

2. The photoelectric conversion apparatus according to claim 1, wherein area of a light incidence surface of the first photoelectric conversion circuit is smaller than area of a light incidence surface of the second photoelectric conversion circuit.

3. The photoelectric conversion apparatus according to claim 1, wherein the second photoelectric conversion circuit surrounds the first photoelectric conversion circuit.

4. The photoelectric conversion apparatus according to claim 1, wherein the diverging lens is a lens formed by covering a convex portion of the semiconductor substrate with a material having a refractive index lower than a refractive index of the semiconductor substrate.

5. The photoelectric conversion apparatus according to claim 1, wherein the diverging lens is a Fresnel lens that functions as a concave lens.

6. The photoelectric conversion apparatus according to claim 1, wherein the diverging lens is a lens formed by covering a convex portion of a dielectric material layer provided on the semiconductor substrate with a material having a refractive index lower than a refractive index of the dielectric material layer.

7. The photoelectric conversion apparatus according to claim 1, wherein a first light blocking wall for blocking light is disposed between the first photoelectric conversion circuit and the second photoelectric conversion circuit.

8. The photoelectric conversion apparatus according to claim 7, wherein a second light blocking wall for blocking light is disposed between the plurality of pixels.

9. The photoelectric conversion apparatus according to claim 8, wherein height of the second light blocking wall is greater than height of the first light blocking wall.

10. The photoelectric conversion apparatus according to claim 1, wherein a separation portion for limiting movement of electric charges is disposed between the first photoelectric conversion circuit and the second photoelectric conversion circuit.

11. The photoelectric conversion apparatus according to claim 1, wherein a separation portion for limiting movement of electric charges is disposed between the plurality pixels.

12. The photoelectric conversion apparatus according to claim 1, wherein the sensitivity to incident light of the first photoelectric conversion circuit is lower than the sensitivity to incident light of the second photoelectric conversion circuit.

13. The photoelectric conversion apparatus according to claim 12, wherein area of a light incidence surface of the first photoelectric conversion circuit is smaller than area of a light incidence surface of the second photoelectric conversion circuit.

14. A semiconductor substrate comprising:
a plurality of pixels; and
a diverging lens configured to diverge incident light,
wherein each of the plurality of pixels includes a first photoelectric conversion circuit and a second photoelectric conversion circuit,
wherein the diverging lens covers at least a part of the first photoelectric conversion circuit in a plan view, and
wherein the first photoelectric conversion circuit and the second photoelectric conversion circuit are different in sensitivity to incident light.

15. A photoelectric conversion apparatus comprising:
a plurality of pixels each including a first photoelectric conversion circuit, a second photoelectric conversion circuit, and a diverging lens for diverging incident light,
wherein the diverging lens is disposed on a semiconductor substrate where the first photoelectric conversion circuit and the second photoelectric conversion circuit are disposed, and covers at least a part of the first photoelectric conversion circuit in a plan view as viewed from a light incidence side, and
wherein area of a light incidence surface of the first photoelectric conversion circuit is smaller than area of a light incidence surface of the second photoelectric conversion circuit.

16. The photoelectric conversion apparatus according to claim 15, wherein the second photoelectric conversion circuit surrounds the first photoelectric conversion circuit.

17. The photoelectric conversion apparatus according to claim 15, wherein the diverging lens is a lens formed by covering a convex portion of the semiconductor substrate with a material having a refractive index lower than a refractive index of the semiconductor substrate.

18. The photoelectric conversion apparatus according to claim 15, wherein the diverging lens is a Fresnel lens that functions as a concave lens.

19. A photoelectric conversion system comprising:
the photoelectric conversion apparatus according to claim 1; and
a signal processing circuit configured to generate an image, using a signal output by the photoelectric conversion apparatus.

20. A moving body comprising:
the photoelectric conversion apparatus according to claim 1; and
a control circuit configured to control movement of the moving body, using a signal output by the photoelectric conversion apparatus.

* * * * *